(12) United States Patent
Stoltz

(10) Patent No.: US 9,235,811 B2
(45) Date of Patent: Jan. 12, 2016

(54) CREATION OF A MAXIMALLY ENTANGLED QUANTUM STATE

(71) Applicant: Raytheon Company, Waltham, MA (US)

(72) Inventor: Steven M. Stoltz, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/205,541

(22) Filed: Mar. 12, 2014

(65) Prior Publication Data

US 2015/0262072 A1    Sep. 17, 2015

(51) Int. Cl.

| | |
|---|---|
| *H01L 29/225* | (2006.01) |
| *G06N 99/00* | (2010.01) |
| *H01L 39/02* | (2006.01) |
| *H01L 39/12* | (2006.01) |
| *H01L 39/22* | (2006.01) |
| *H01L 39/24* | (2006.01) |
| *H01L 27/18* | (2006.01) |

(52) U.S. Cl.
CPC .............. *G06N 99/002* (2013.01); *H01L 27/18* (2013.01); *H01L 39/025* (2013.01); *H01L 39/125* (2013.01); *H01L 39/223* (2013.01); *H01L 39/2406* (2013.01); *H01L 39/2493* (2013.01)

(58) Field of Classification Search
CPC ....................................................... B82Y 10/00
See application file for complete search history.

(56) References Cited

U.S. PATENT DOCUMENTS

| | | | |
|---|---|---|---|
| 6,534,783 B1 | 3/2003 | Wu et al. | |
| 6,930,320 B2 | 8/2005 | Blais et al. | |
| 7,132,676 B2 * | 11/2006 | Shields et al. | 257/14 |
| 7,655,517 B2 | 2/2010 | Nikonov et al. | |
| 7,836,007 B2 | 11/2010 | Beausoleil et al. | |
| 2004/0238813 A1 * | 12/2004 | Lidar et al. | 257/31 |
| 2008/0075410 A1 * | 3/2008 | Spillane et al. | 385/122 |
| 2009/0097510 A1 * | 4/2009 | Tignon et al. | 372/21 |

OTHER PUBLICATIONS www.bbn.com, accessed Mar. 11, 2014, 2 pages.
www.bbn.com/technology.quantum, accessed Mar. 11, 2014, 4 pages.
bbn.com/technology/quantum/pubs, accessed Mar. 11, 2014, 5 pages.
Carter, Tom, "Entangled quantum states", http://csustan.csustan.edu/~ tom/MISC/qc-article/node6.html, accessed Jan. 23, 2014, 2 pages.
"Chapter 2: Properties of lithium niobate", Material Poperties of Lithium Niobate, accessed Mar. 3, 2014, http://www.orc.soton.ac.uk/publications/theses/2762_jaa/2762_jaa_3.pdf, 28 pages.
"Electromagnetic Frequency, Wavelength and Energy Ultra Calculator", Frequency and Wavelength Calculator, http://www.1728.org/freqwave.htm, accessed Mar. 3, 2014, 3 pages.

(Continued)

*Primary Examiner* — Jerome Jackson, Jr.
(74) *Attorney, Agent, or Firm* — Cantor Colburn LLP

(57) ABSTRACT

Embodiments are directed to engineering a structure, comprising: measuring energy eigenstates of a Hamiltonian, predicting a time evolution of a combination of two energy eigenstates based on the measurement, and creating an entangled quantum state for two coefficients of the two energy eigenstates such that an associated wavefunction is encouraged to undergo the predicted time evolution.

20 Claims, 10 Drawing Sheets

(56) References Cited

OTHER PUBLICATIONS

Electronic 360 Microwaves101.com, "Ferroelectric phase shifters", updated Apr. 13, 2006, http://www.microwaves101.com/encyclopedia/phaseshifters_ferro.cfm, 6 pages.
Fitzpatrick, Richard, "Two particle systems", http://farside.ph.utexas.edu/teaching/qmech/lectures/node58.html, Dec. 12, 2006, 3 pages.
Fu, L.P. et al., "Faraday rotation from Zn1-xFexSe epilayers", Appl. Phys. Lett, vol. 60, No. 5, Feb. 3, 1992, pp. 583-585.
Furdyna, J. K., "Diluted magnetic semiconductors", J. Appl. Phys. 64 (4), Aug. 15, 1988, pp. R29-R64.
Furdyna, J. K., et al., "Magnetic properties of diluted magnetic semiconductors: A review (invited)" J Appl. Phys. 61 (8), Apr. 15, 1987, pp. 3526-3531.
Jiang, H. et al., "Transparent Electro-Optic Ceramics and Devices", http://www.bostonati.com/whitepapers/SPIE04paper.pdf, accessed Mar. 3, 2014, 15 pages.
Jonker, B. T. et al., "Spin seperation in diluted magnetic semiconductor quantum well systems (invited)", J. Appl. Phys. 69 (8) Apr. 15, 1991, pp. 6097-6102.
Jordan, Stephen, "Algebraic and Number Theoretic Algorithms", Quantum Algorithm Zoo, The National Institute of Standards and Technology (NIST), http://math.nist.gov/quantum/zoo/, accessed Jan. 23, 2014, 24 pages.
Kim, Young-Tae et al., "Low-Loss Phase Shifter with a Microstrip Structure Using Ferroelectric BST Thin Films", Journal of Korean Physical Society, vol. 49, No. 3, Sep. 2006, pp. 1143-1147.
Google Scholar Citations, "Thomas Ohki", : http://scholar.google.com/citations?view_op=view_citation&hl=en&user=JiTwdIYAAAAJ&citation_for_view=JiTwdIYAAAAJ:YsMSGLbcyi4C, accessed Mar. 11, 2014, 2 pages.
Researchgate.net "Low-Jc Single Flux Quantum (RSFQ) Qubit Circuit" https://www.researchgate.net/publication/3313323_Low-Jc_Rapid_Single_Flux_Quantum_%28RSFQ%29_Qubit_Control_Circuit, accessed Mar. 11, 2014, 1 page.
Petrou, et al., "Spin-dependent confinement in DMS-based heterostructures (invited)" J. Appl. Phys. 75(10) May 15, 1994, pp. 5714-5718.
"Quantum Dot Fabrication using Tip of an AFM", video accessed Jan. 23, 2014, http://www.azonano.com/nanotechnology-video-details.aspx?VidID=170, 2 pages.
Science.gov, sample records for the topic rapid single-fluc quantum, accessed Mar. 11, 2014, 7 pages.
Steer, Brian et al., "Extended Internaction Klystron Technology at Millimeter and Sub-Millimeter Wavelengths", http://www.cpii.com/docs/related/40/EIK%20Technology%20at%20MMW%20&%20SubMMW%20Wavelengths.pdf, accessed Feb. 27, 2014, 5 pages.
Thomasnet.com, "Photolithography Service Suppliers", http://www.thomasnet.com/products/photolithography-services-57850745-1.html, accessed Feb. 27, 2014, 2 pages.
"Unitary time evolution", http://www-bcf.usc.edu/~tbrun/Course/lecture05.pdf, accessed Mar. 10, 2014, lecture, 25 pages.
Waddell, Jack, "Nanostructure Fabrication and Nano-SQUIDS" http://www-bcf.usc.edu/~tbrun/Course/lecture05.pdf, accessed Feb. 27, 2014, 6 pages.
Walker, Christopher, Department of Astronomy and Steward Observatory, https://www.as.arizona.edu/people/faculty/christopher-walker, accessed Mar. 11, 2014, 2 pages.
Walker, Christopher, College of Optical Services, University of Arizona, accessed Mar. 11, 2014, http://www.optics.arizona.edu/research/faculty/profile/christopher-k-walker, 2 pages.
Wikipedia article, "Local oxidation nanolithography", http://en.wikipedia.org/wiki/AFM_Nanolithography, accessed Feb. 27, 2014, 5 pages.
Wikipedia article, "Fermi's golden rule", http://en.wikipedia.org/wiki/Fermi's_golden_rule, accessed Feb. 27, 2014, 2 pages.
Wikipedia article, "Josephson effect", http://en.wikipedia.org/wiki/Josephson_effect, accessed Feb. 27, 2014, 4 pages.
Wikipedia article, "Klystron" http://en.wikipedia.org/wiki/Klystron, accessed Feb. 27, 2014, 6 pages.
Wikipedia article, "Lithium niobate", http://en.wikipedia.org/wiki/Lithium_niobate, accessed Mar. 3, 2014, 3 pages.
Wikipedia article "DC SQUID.svg" accessed Mar. 3, 2014, http://en.wikipedia.org/wiki/File:DC_SQUID.svg, 2 pages.
Wikipedia.org article, "Photolithography", accessed Jan. 23, 2014, 9 pages.
Wikipedia article, "Quantum entanglement", http://en.wikipedia.org/wiki/Quantum_entanglement, accessed Feb. 27, 2014, 9 pages.
Wikipedia article, "Raman microscope" accessed Mar. 3, 2014, http://en.wikipedia.org/wiki/Raman_microscope, 1 page.
Wikipedia.org article, "Rapid Single Flux Quantum", http://en.wikipedia.org/wiki/Rapid_single_flux_quantum, accessed Jan. 23, 2014, 3 pages.
Wikipedia article, http://en.wikipedia.org/wiki/Stationary_state, accessed Jan. 23, 2014, 4 pages.
http://www.tifr.res.in/~sangho10/meas-figs/ple-sqw.gif, accessed Jan. 23, 2014, 1 page.
Yoshikawa, M. et al., "Defect characterization of Si-doped GaN films by a scanning near-field optical microscope-induced photoluminescence", Abstract, http://scitation.aip.org/content/aip/journal/apl/88/16/10.1063/1.2190270, 2006, 2 pages.

\* cited by examiner

CREATION OF A MAXIMALLY ENTANGLED QUANTUM STATE

BACKGROUND

The present disclosure relates to electronics and optics, and more specifically, to quantum computing.

In the field of quantum computing, computations are performed on a quantum state of the system, where the quantum system is viewed as being comprised of multiple particles. According to the postulates of quantum physics, any dynamical variable that can be measured in a system has a corresponding mathematical operator that acts on the system's wavefunction to "extract" the results of the measurement. Given such an operator, $A_1$ (for a single particle #1) the postulate says that the measurement of the variable A corresponds to the mathematical action of operator A on the particle 1 component of the system's wavefunction, yielding for the observer the result of the measurement, $a_{1,m}$, (the $m^{th}$ eigenvalue of dynamical variable A for particle 1) which assures the observer that after the measurement, the system is in the $m^{th}$ allowable eigenfunction $|\Psi_M>_{Particle1}$ of $A_1$ corresponding to the eigenvalue $a_{1,m}$ that was observed. Stated in mathematical terms:

$$A_1|\Psi_M>_{Particle1} = a_{1,m}|\Psi_M>_{Particle1}$$

Whenever there are two particles in a system, the system's wavefunction can be represented in a basis of operator A eigenstates (where A is position, momentum, energy, etc.) as a direct product:

$$|\Psi_M>_{Particle1}|\Psi_N>_{Particle2},$$

which yields different results for measurement of the dynamical variable A for particle 1 ($A_1$ operator yields the $m^{th}$ eigenvalue $a_{1,m}$) than the particle 2 ($A_2$ operator yields the $n^{th}$ eigenvalue $a_{2,N}$):

$$A_1|\Psi_M>_{Particle1}|\Psi_N>_{Particle2} = a_{1,m}|\Psi_M>_{Particle1}|\Psi_N>_{Particle2}, \text{ and}$$

$$A_2|\Psi_M>_{Particle1}|\Psi_N>_{Particle2} = a_{2,n}|\Psi_M>_{Particle1}|\Psi_N>_{Particle2}.$$

Prior to measurement, there is no reason why the state must be an eigenstate of any particular operator, because it is solely the act of measurement which defines the state. For example, it is possible for the state of the system prior to measurement to be in a linear superposition of state L and M for particle 1 as follows:

$$\left[\frac{|\psi_L>_{Particle1} + |\psi_M>_{Particle1}}{\sqrt{2}}\right]|\psi_N>_{Particle2}$$

The above state of the system is not regarded to be entangled—because the outcome of measurement of particle 2 is not coupled to the outcome of the measurement for particle 1. However, the state:

$$\frac{|\psi_1>_{Particle1}|\psi_2>_{Particle2} + |\psi_2>_{Particle1}|\psi_1>_{Particle2}}{\sqrt{2}},$$

is entangled because if the result of measurement with $A_1$ is 1 (which collapses the wavefunction into the first direct product in the above sum after measurement) then the outcome for particle 2 must be 2, and conversely if the outcome for particle 1 is 2 (yielding the second direct product in the above sum) then the outcome for particle 2 must be 1.

It can be shown from the time dependent Shrodinger equation, that if a single particle is in a pure eigenstate of the Hamiltonian, then this state is a standing wave whose spatial probability density (SPD) does not change in time. Conversely, when a single particle is in a linear superposition of two energy eigenstates, its shape changes and has a definite time evolution to it, and is not a standing wave. The two eigenstates in the superposition evolve with two different temporal phase terms so as to "beat against each other" in phase and the overall SPD oscillates with an angular frequency of oscillation proportional to the energy difference of the two states.

SUMMARY

According to one embodiment, a method for engineering a structure, comprises: measuring energy eigenstates of a Hamiltonian, predicting a time evolution of a combination of two energy eigenstates based on the measurement, and creating an entangled quantum state for two coefficients of the two energy eigenstates such that an associated wavefunction is encouraged to undergo the predicted time evolution.

According to another embodiment, a structure comprises: a plurality of fingers constructed from an electro-optical material coupled to a plurality of optical feed lines, and electrodes coupled to the fingers, wherein an electric field applied to the electrodes is controlled to create an entangled quantum state for at least two coefficients of a combination of at least two energy eigenstates such that an associated wavefunction is encouraged to undergo a predicted time evolution that is based on measured energy eigenstates.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
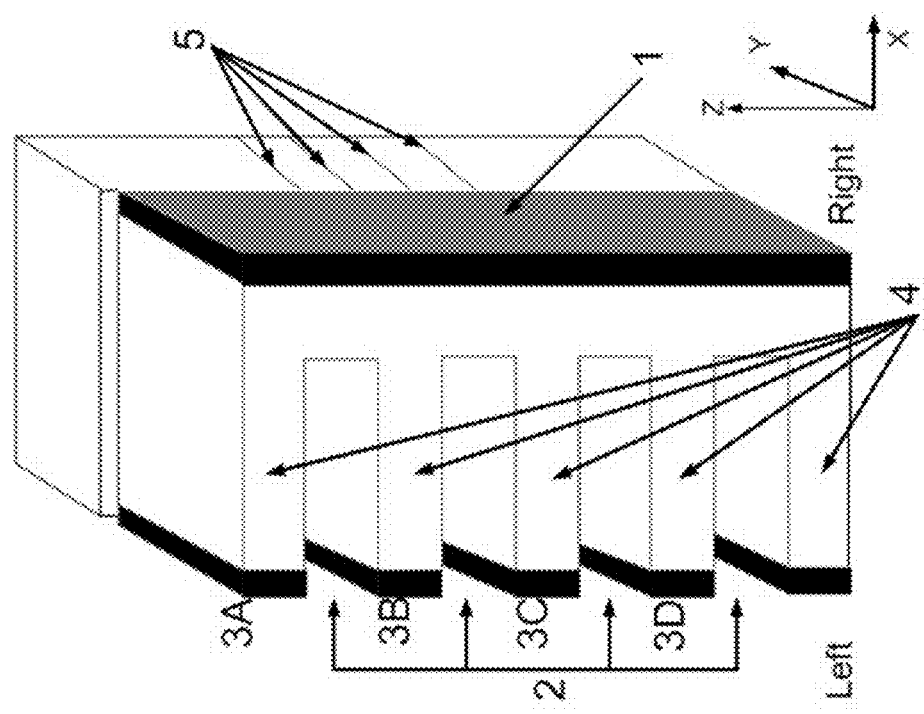
FIG. 1 is a diagram of a single frequency vertical profile unit.

It is noted that various connections are set forth between elements in the following description and in the drawings (the contents of which are included in this disclosure by way of reference). It is noted that these connections in general may be direct or indirect and that this specification is not intended to be limiting in this respect. In this respect, a coupling between entities may refer to either a direct or an indirect connection.

Exemplary embodiments of apparatuses, systems, and methods are described for entangling electron spins in one or more structures or materials. In some embodiments, the entanglement may be achieved in a systematic or controlled manner. In some embodiments, a voltage applied to a structure, or a portion of the structure, may be controlled so as to influence an index of refraction of an optical medium, which in turn may enable control over a speed of propagation of light over the medium.

FIG. 1 illustrates what will be referred to herein as a "single frequency vertical profile unit". The embodiment shown in FIG. 1 can be used for operation at visible and infrared wavelengths. The embodiment of FIG. 1 may be slightly refined to operate at radar wavelengths.

Multiple optical feed lines, all of the same frequency, are optically coupled into the different fingers 4 on the front face of FIG. 1, which may be constructed from an electro-optic material (e.g., lithium niobate substrate) that has ridges etched by removing material from the gaps depicted by reference character 2 in FIG. 1. Each finger 4 may be a waveguide. Electric fields are applied along, e.g., the x-axis of FIG. 1 by a plurality of metallic electrodes 3A, 3B, 3C, 3D, etc., and the ground plane established by a metallic electrode 1. Light outputs from the plurality of fingers 4 may strike different layers of a semiconductor multiple quantum well structure 5.

Control electronics may be used to excite the structure of FIG. 1. In some embodiments, static fields, i.e., non-time varying voltages applied across 3A and 1 (or 3B and 1, . . . etc.) may be used. This makes the control electronics easy to design and implement, other than the fact that if one wants to reduce the amount of voltage required to induce a propagation delay along the y-direction (the propagation direction), that one may have to make the structure of FIG. 1 longer in the y-direction. As one of the frequency components of the wavefunction oscillates up and down in z-direction (with same frequency at every value of z, which is the frequency of vibration of the light itself, but different phase delays at each z), in addition to a peak-to-peak amplitude and phase, it can also have a static average value/bias/offset at a particular z. The bias value can be controlled by a plurality of thin/transparent grating electrodes (held at a fixed voltages) placed at the different locations of 5 in FIG. 6 (on the semiconductor itself). The voltage algorithm described in Appendix 2 below would be used to deduce the set of static voltages that would need to be applied to the fingers 3A, 3B, . . . etc. (with possibility of an additional bias voltage at a given height z on the surface of the semiconductor) for a given desired superposition state. So, the structure might only require static voltages. In some embodiments, such as where the components referenced in FIG. 1 are shorter in the y-direction, higher voltages may be used—i.e., a high voltage power supply with a plurality of different voltages.

Figure 2:
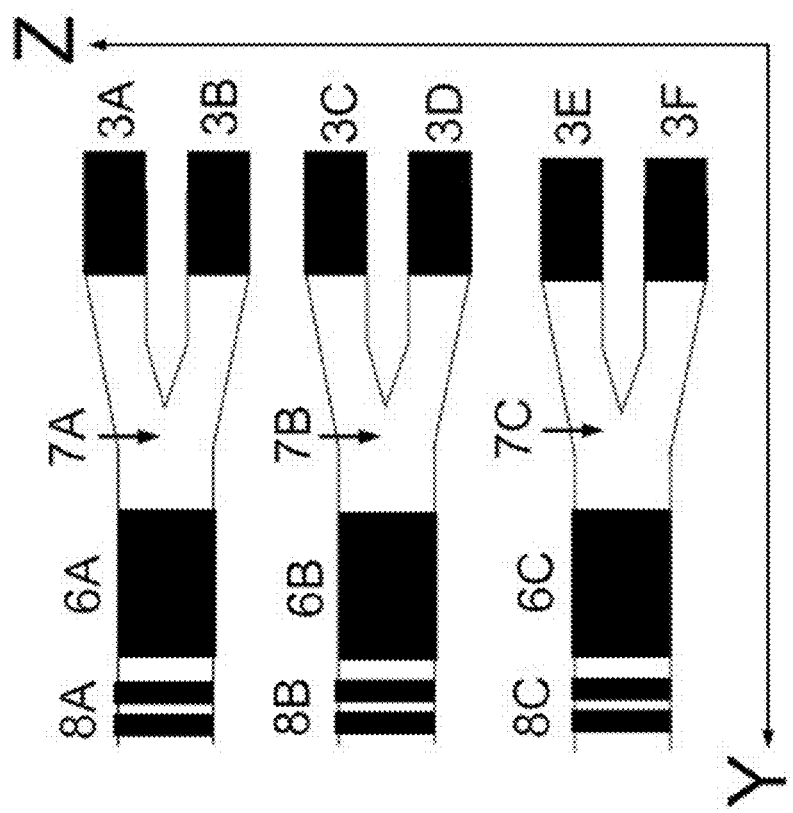
FIG. 2 illustrates the left side of the single frequency vertical profile unit of FIG. 1.

FIG. 2 is a side view of the single frequency vertical profile unit. In FIG. 2, two beams of the same frequency enter into electrodes 3A and 3B either destructively or constructively interfere with each other, depending on the relative phase difference in the propagation delay between electrode 3A (also depicted in FIG. 1) to finger portion 7A and electrode 3B to finger portion 7A, induced by the difference in voltage applied to the metallic face/electrode 3A, relative to the voltage in electrode 3B. This type of "Y" structure is referred to as a Mach Zehnder interferometer. The phase shift in any of the individual channels 3A, 3B, 3C, 3D, 3E, 3F, etc., between the front face and finger portions 7A, 7B, 7C, etc., is $2\pi(nd)/\lambda$, where n is the index of refraction of the electro-optic material (e.g., lithium niobate), and d is the length travelled from, e.g., electrode 3A or electrode 3B to finger portion 7A (in the 'y' direction). The phase difference between any two adjacent channels (3A and 3B, for example) in the Mach Zehnder interferometer is $2\pi(\Delta n\, d)/\lambda$, where $\Delta n=n2-n1$ is controlled by the difference in voltage applied to electrode 3A relative to electrode 3B.

The Mach Zehnder interference controls the amplitude of the signal at finger portion 7A, giving the amplitude a z-dependence across the structure while the voltages at control mechanisms 6A, 6B, and 6C, create additional differences in phase in the z-direction due to differences in optical path length propagation delay. Reference characters 8A, 8B, and 8C in FIG. 2 may represent additional control mechanisms that may be used in some embodiments to further control signals so as to obtain desired or predetermined wave function characteristics.

Use of lithium niobate in embodiments associated with FIGS. 1-2 described above may have wavelength transparency restrictions which prevent its use at radar wavelengths. Given the optical transparency restrictions, the practical limit to maximum allowable wavelength may be approximately 7000 nm, which yields a minimum photon energy of 0.17712 eV. In some embodiments, photon energies that are lower than this (longer wavelengths at near THz frequencies) may be desired, which are no higher in photon energy than the maximum enhanced Zeeman splitting of the +½ and −½ electron in a diluted magnetic semiconductor spin superlattice (the maximum photon energy difference associated with the enhanced Zeeman splitting is about 0.040 eV, which is about $9.6720 \times 10^{12}$ Hz). For such embodiments, the fingers 4 in FIG. 1 may be comprised of barium titanate (BaTiO3), strontium titanate (SrTiO3), or ferroelectric BST thin film, instead of lithium niobate, and photons may actually be guided/conducted through the metallic electrodes (3A, 3B, 3C of FIG. 1). For visible/IR wavelengths, the photons are propagated in the lithium niobate fingers (the light is optically confined/index confined there by total internal reflection), but for ferroelectric BST thin films, the microwaves propagate through metallic strip lines.

In some embodiments, beams that enter the front face start off having the same phase, because they are all driven from the same source, e.g., a laser for visible/IR wavelengths or a Terahertz(THz) electromagnetic wave. This THz electromagnetic wave may be generated by the AC Josephson effect, then up-converted to a desired higher frequency by $2^{nd}$ harmonic generation, and subsequently amplified by a vacuum tube (e.g., a klystron).

Figure 3:
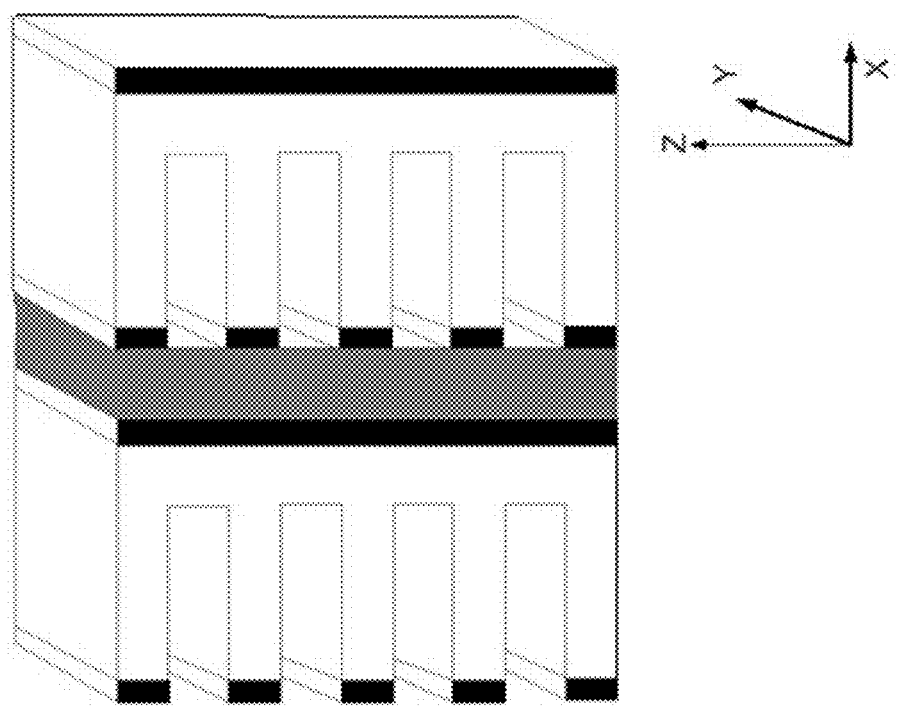
FIG. 3 illustrates a diagram of two single frequency vertical profile units placed alongside one another.

Referring to FIG. 3, another embodiment is shown. The embodiment of FIG. 3 shows two single frequency vertical profile units placed alongside each other. A technique for constructing a plurality of such structures or units, back-to-back may include multiple tasks or operations. A first task involves etching ridges (as in reference character 2 of FIG. 1)

into a monolithic slab of, e.g., lithium niobate. After these ridges are etched into the structure, a second task involves etching a second set of vertical ridges, each having a fixed x-coordinate (up and down in the z-direction). The $2^{nd}$ set of ridges will cut into the fingers 4 of FIG. 1 a given depth along the y-axis, so as to define the gap between the 2 vertical profile units shown in FIG. 3. Then, an insulating boundary with metal contacts on either side of it can be inserted into the gap and attached to the structure. The etching may be performed in a shallow manner or fashion with respect to the y-direction to ensure that the fingers 4 of FIG. 1 are not severed. Some space may be left in the back of the structure, where all of the individual beams emerge into a contiguous block of lithium niobate. An alternative method is simply to bond two units together.

Generalizing based on the embodiment of FIG. 3, an intended structure may be a set of N different frequency profile units. A distinct THz frequency may be assigned to propagate at a fixed x-coordinate for one of the vertical profile frequency units in the structure. The permutation of frequencies in the x-direction (i.e. 1, 2, 3, ... N) may repeat.

Figure 4:
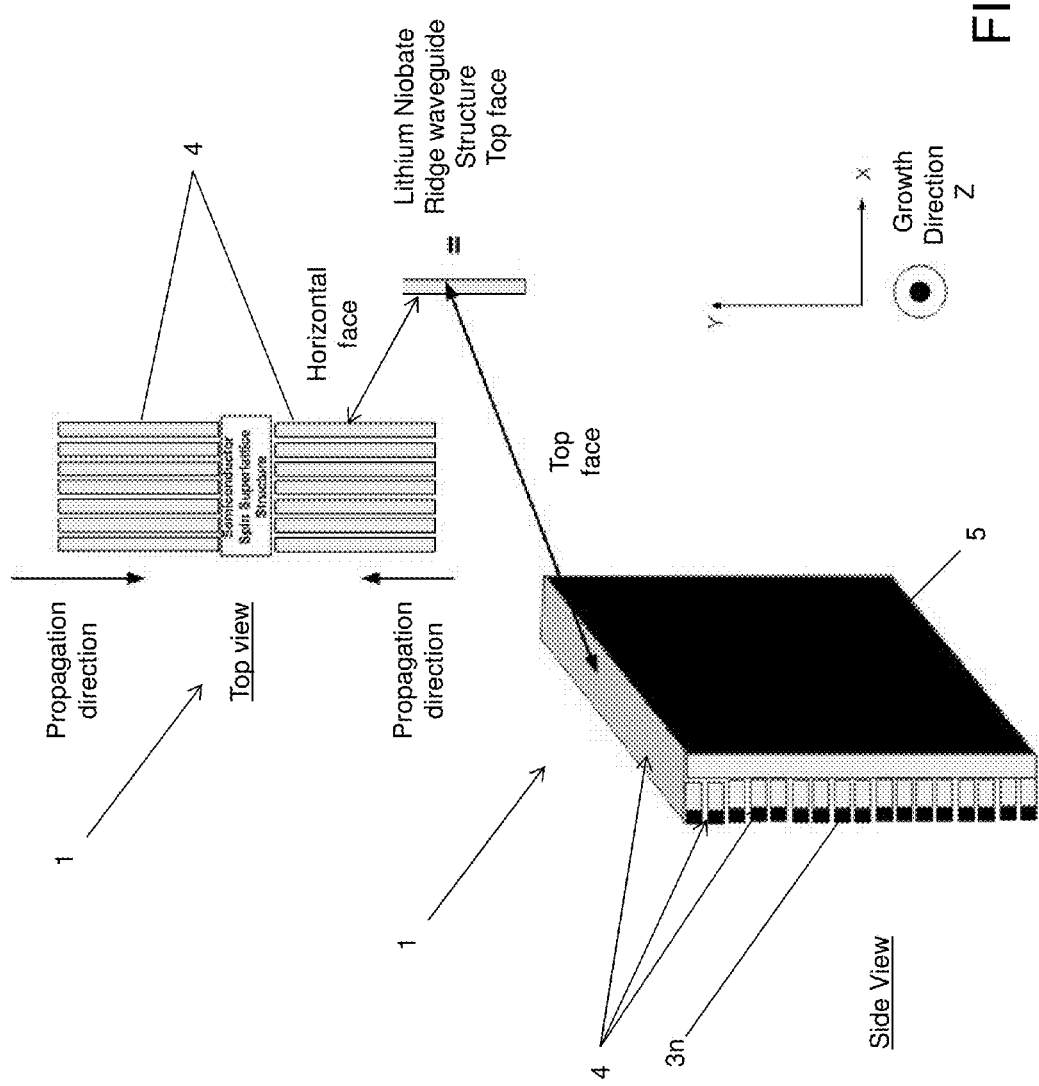
FIG. 4 illustrates a diagram of an alignment of a backside of a vertical profile unit with a semiconductor spin superlattice structure.
Figure 5:
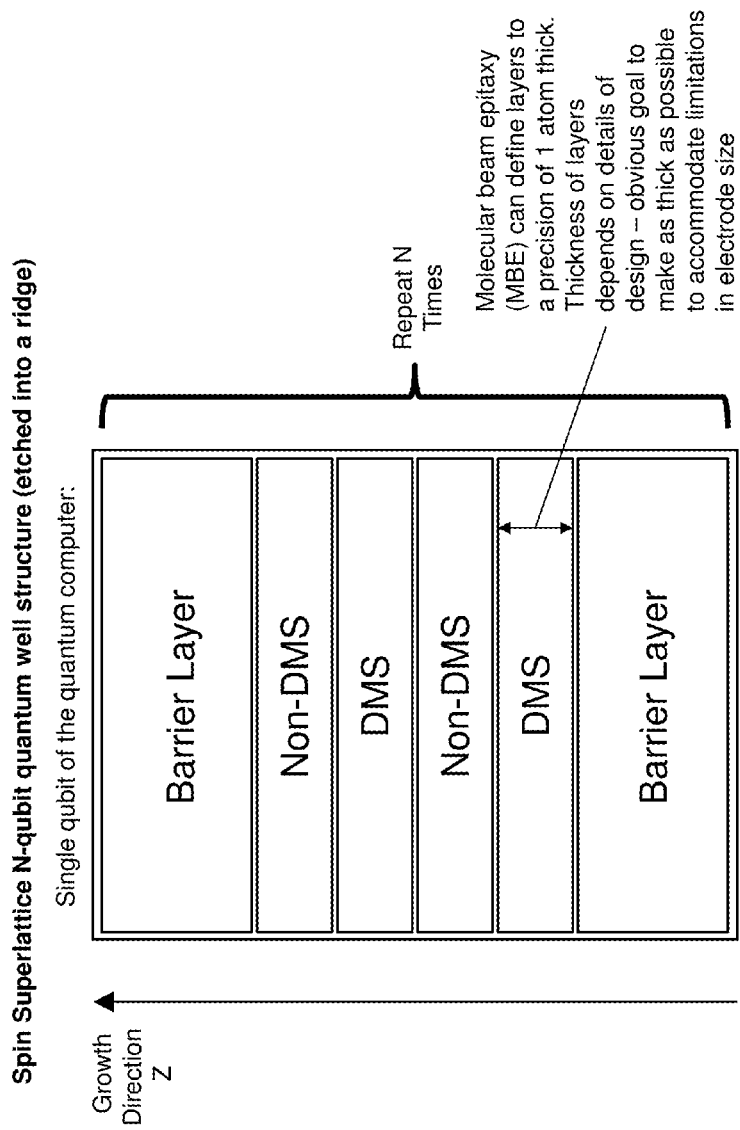
FIG. 5 illustrates a spin superlattice N-qubit quantum well structure before it is etched into a ridge.

When the THz beams of different frequencies are aggregated in the back faces of the vertical profile frequency units, the plurality of frequencies emerge from the back of the structure where the different beams homogenize at the back into a conglomeration of frequencies. As indicated in FIGS. 4-5, the back of the vertical profile units is aligned with a semiconductor spin superlattice structure. The z-dependence of the amplitude and phase of the electromagnetic field in the lithium niobate waveguides can be controlled in such a way as to electrically bias the semiconductor to induce a linear superposition state to form. This is because a linear superposition state (unlike a stationary state of a precisely defined energy) has an a-priori knowable time evolution like a spring on a mass.

Figure 6:
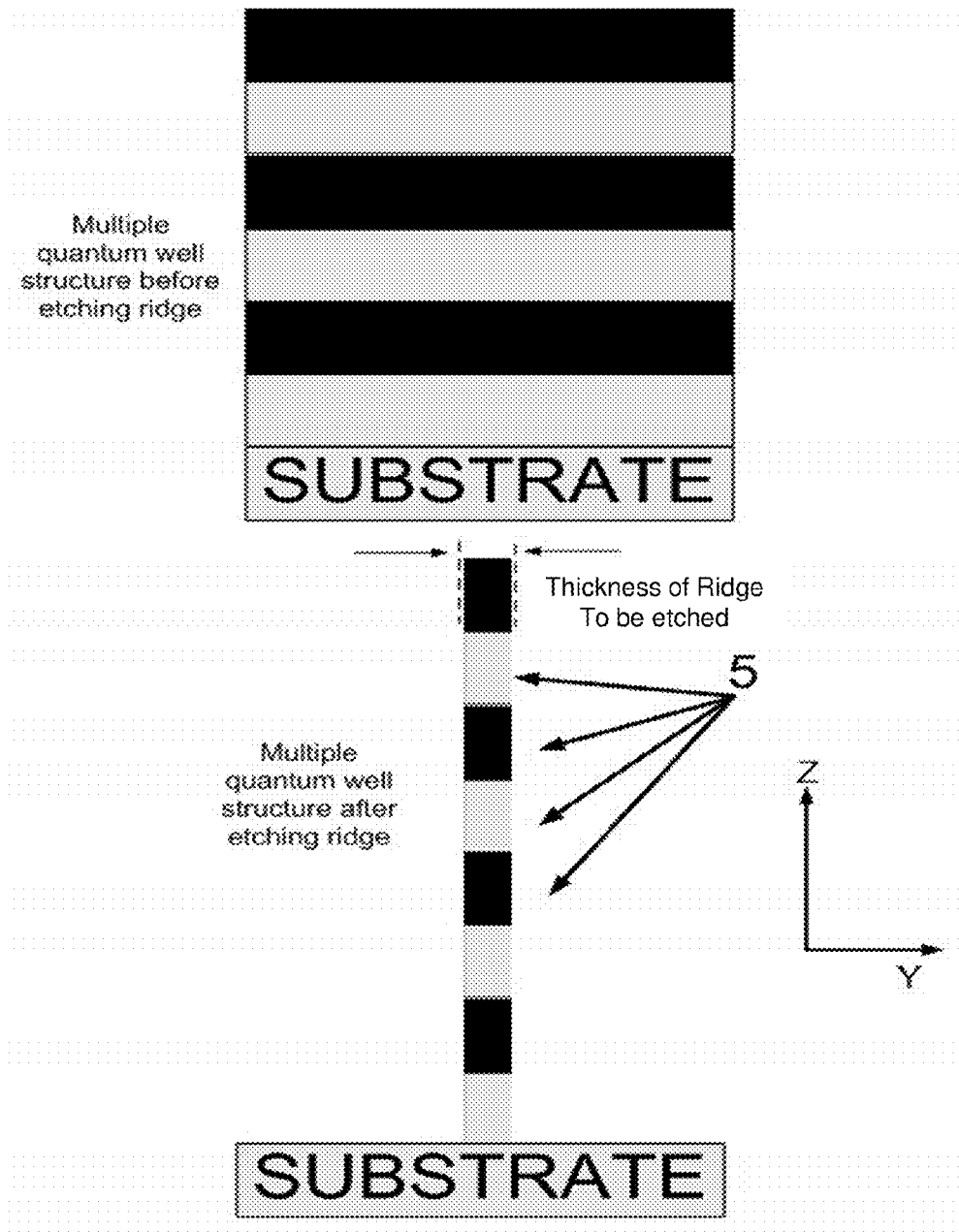
FIG. 6 illustrates the multiple quantum well structure (as in FIG. 5) before being etched into a ridge (top), and after being etched into a ridge (bottom)

Referring now to FIG. 6, the upper half of FIG. 6 shows the multiple quantum well structure before ridges have been etched into it, and the lower half of FIG. 6 shows its appearance after ridges have been etched into it. The thickness of the ridge to be etched is indicated by the pair of arrows and dashed vertical lines in FIG. 6. The ridge structure is narrow along the same dimension/direction (the y-axis) that defines the direction of propagation through the fingers 4 in FIG. 1. Given the fact that an electric field is defined as V/d, the narrower the ridge width, d, is in the y-direction the higher the electric field is in the y-direction of the semiconductor superlattice structure.

Figure 7:
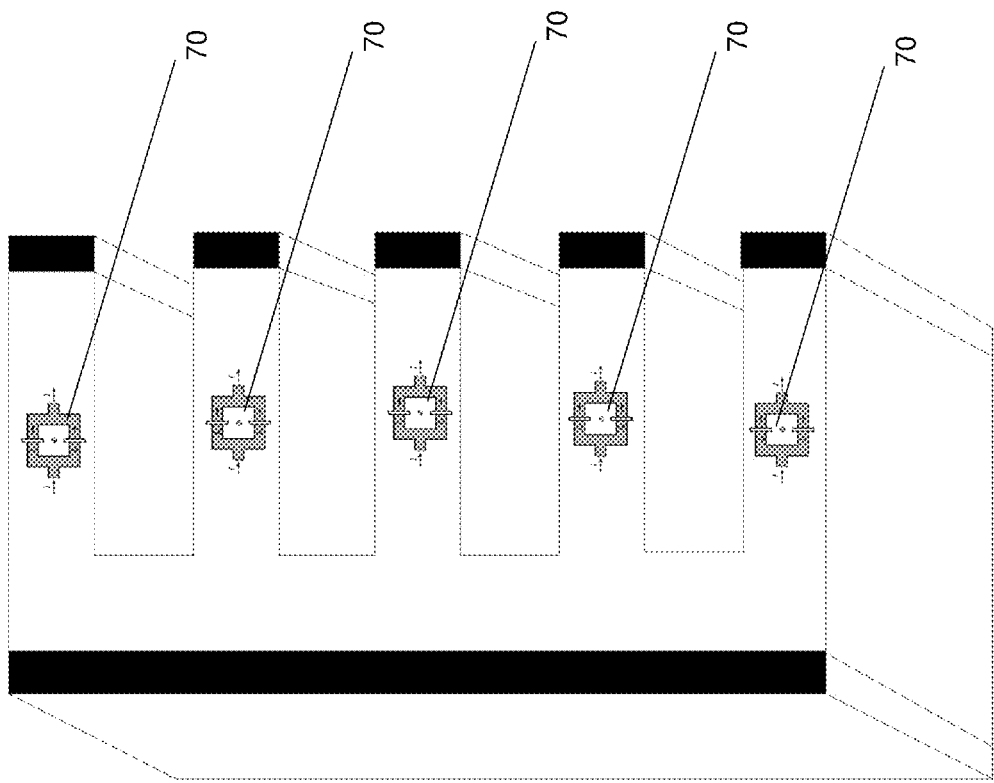
FIG. 7 illustrates a rear end view of a vertical profile unit.

FIG. 7 shows the rear end of a vertical profile unit, which have squid magnetometer loops 70 deposited on the faces. The purpose of a squid magnetometer 70 is to take very sensitive magnetic field measurements, after the quantum computations are performed on the entangled input state. These magnetic field measurements assess the magnetization associated with the spin states in the spin superlattice. Other current loops (not shown in FIG. 7) are wrapped around the circumference of the vertical profile unit in a solenoid coil which extends along the propagation direction/length of the vertical profile unit. When these coils are energized with short time duration pulses, they produce magnetic fields perpendicular to the output face of the vertical profile unit, which cause the spins to precess, as in nuclear magnetic resonance, in accordance with the type of quantum computations that are desired.

The plurality of lithium niobate waveguides is used to create a z-dependent voltage profile that encourages a linear superposition quantum state and/or entangled quantum states to form within the semiconductor spin superlattice. If two energy eigenstates of the time independent Schrodinger equation ($H\psi = E\psi$) are considered, the time dependent Schrodinger equation $$\left(H\Psi = i\hbar \frac{\partial \Psi}{\partial t}\right)$$

can be integrated to give the following individual time dependence of two "stationary states" $\psi 1$ and $\psi 2$:

$$H\Psi_1 = E_1\Psi_1 = i\hbar\frac{\partial \Psi_1}{\partial t} \rightarrow \Psi_1(t) = \exp\left[\frac{-iE_1t}{\hbar}\right]\Psi_1(0) \quad (1)$$

$$H\Psi_2 = E_2\Psi_2 = i\hbar\frac{\partial \Psi_2}{\partial t} \rightarrow \Psi_2(t) = \exp\left[\frac{-iE_2t}{\hbar}\right]\Psi_2(0)$$

The time dependence of a linear superposition $\psi 12$ of these two states is given by the time-dependent Schrodinger equation as:

$$H\Psi_{12} = H[a\Psi_1 + b\Psi_2] = a\exp\left[\frac{-iE_1t}{\hbar}\right]\Psi_1(0) + b\exp\left[\frac{-iE_2t}{\hbar}\right]\Psi_2(0), \quad (2)$$

where $$|\Psi_{12}(t,z)|^2 = \quad (3)$$
$$a^2\psi_1^2(0,z) + 2ab\cos\left[\frac{(E_2-E_1)t}{\hbar}\right]\psi_1(0,z)\psi_2(0,z) + b^2\psi_2^2(0)$$

In equation (3) above, the two functions $\psi_1$, $\psi_2$ and the coefficients a and b are real valued (which is satisfactory when speaking about the envelope function in a(1) semiconductor heterostructure). The two states are seen to beat against each other at the frequency:

$$\omega_{12} = \frac{(E_2 - E_1)}{\hbar}. \quad (4)$$

For a linear superposition of three states, equation (2) would become equation (2a) as follows:

$$H\Psi_{123} = H[a\Psi_1 + b\Psi_2 + c\Psi_3] =$$
$$a\exp\left[\frac{-iE_1t}{\hbar}\right]\Psi_1(0) + b\exp\left[\frac{-iE_2t}{\hbar}\right]\Psi_2(0) + c\exp\left[\frac{-iE_3t}{\hbar}\right]\Psi_3(0)$$

where $\Psi_{123}$ is given by equation (3a) as follows:

$$|\Psi_{123}(t,z)|^2 = a^2\Psi_1^2(0,z) + b^2\Psi_2^2(0,z) +$$
$$c^2\Psi_3^2(0,z) + 2bc\cos\left[\frac{(E_3-E_2)t}{\hbar}\right]\Psi_2(0,z)\Psi_3(0,z) +$$
$$2ab\cos\left[\frac{(E_2-E_1)t}{\hbar}\right]\Psi_1(0,z)\Psi_2(0,z) +$$
$$2ac\cos\left[\frac{(E_3-E_1)t}{\hbar}\right]\Psi_1(0,z)\Psi_3(0,z)$$

The probability density of the linear superposition state (equation (3)) oscillates up and down the z-direction of the structure, like a mass on a spring. It is evident from equations (3) and (3A) that a superposition of N energy eigenstates contains N(N−1)/2 distinct pairs of energies, that correspond to N(N−1)/2 distinct vibrational frequencies in the wavefunction. At a fixed value of z, the peak-to-peak amplitude (in time) of each beat frequency's contribution to the total wavefunction is fixed, and is proportional to the product of the spatial amplitudes of the wavefunctions of the two stationary states in that energy pair.

Figure 8:
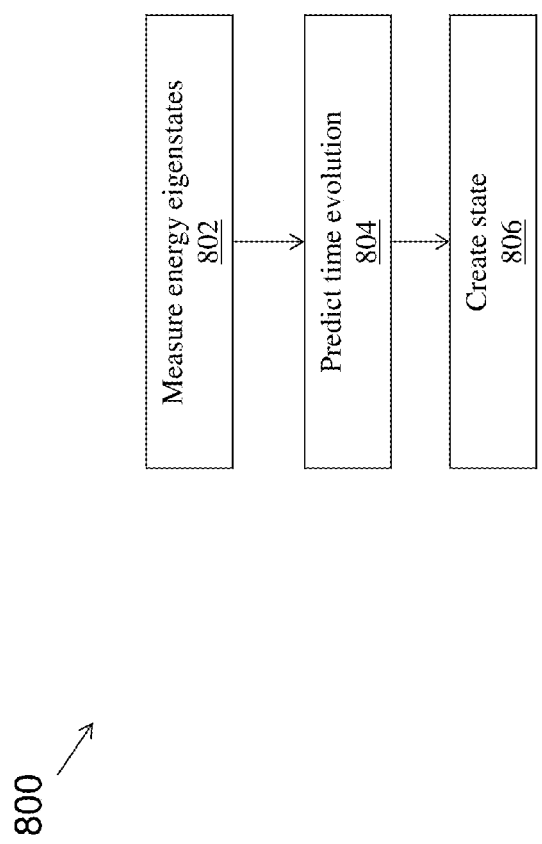
FIG. 8 illustrates a flow chart of an exemplary method.

Referring now to FIG. 8, a flow chart of a method 800 is shown. The method 800 may be tied to, or executed in connection with, one or more components, devices, or systems, such as those described herein. The z-dependence of each of the stationary states and the subband confinement energies (relative to the band edge) within a semiconductor heterostructure can be predicted within a simple envelope function approximation to first order using a one-dimensional quasi-Shrodinger equation. Based on this envelope approximation, the method 800 may be used to design or engineer structures with well widths and quantum well potentials to obtain desired or predetermined subband confinement energies.

In block 802, energy eigenstates of the Hamiltonian of a system may be measured. The measurement may be performed optically, e.g., by recording a spectrum of energy transitions of a real or implemented system.

In block 804, a time evolution of a combination (e.g., a linear combination) of two energy eigenstates, e.g., a |psi 1>+b|psi 2> may be predicted for coefficients 'a' and 'b'. The prediction of block 804 may be based on the measurement of block 802. The prediction of block 804 may be based on an evolution operator of quantum physics, where the evolution operator would be known to one of skill in the art.

In block 806, a state (e.g., an entangled state) may be created that has the desired coefficients 'a' and 'b'. The state may be created by applying a voltage to electrodes in such a way that an associated wavefunction is encouraged to undergo the time evolution predicted in block 804 (as described in equation 3).

Embodiments of the disclosure entangle the quantum states of electrons, but the principle behind the embodiment may be used to entangle the particles in any system (photons, for example) that have stationary states of different energies whose linear superpositions oscillate back and forth spatially. An example might be spatial mode hopping in lasers. Electrons in semiconductor heterostructures may be used to couple to photons in optical devices for a variety of applications. The entangled electrons may give the material nonlinear optical properties allowing it to generate entangled photons (or interact with photons in a complex manner), or allowing for direct optical characterization of the coefficients of the entanglement (in addition to that which can be detected by the squid magnetometer) In spin superlattices, for example, the energy degeneracy of the two spin states is removed by the application of a magnetic field, yielding two interband transitions for the different spin states that occur with different polarizations (left or right circular polarization), which allows the material to impart a Faraday rotation the polarization of light that travels through it. Embodiments of the disclosure may be applied in connection with defense applications, such as quantum radar, LIDAR (which is sometimes, perhaps erroneously, referred to as light detection and ranging), etc., and commercial applications.

In some embodiments, one or more measurements may be conducted to effectively read out a structure. For example, a measurement of the magnetization may be made using a squid magnetometer, and the result of the measurement may be correlated to the spin of the state spatially near the magnetometer. The spin of the "output" state contains the "answer" of an analog computation. With a plurality of squid devices (which are now possible to make as small as a micron or so), a large plurality of magnetization measurements may be obtained which give evidence of the spin state at different points in the material. It is also possible to read the structure out optically. Since the different states to entangle/superimpose may have different energies—a probe pulse, containing the delta energy (e.g., E2-E1), will experience a Faraday rotation proportional to the different coefficients of up/down spin in the superposition. This Faraday rotation arises because the valence band to conduction band transition for one of the conduction band spins has left handed circular polarization, while the valence band to conduction band transition for the other conduction band spin has right handed circular polarization, and because these two transitions occur at different energies—they have different oscillator strengths and contribute differently to the index of refraction which induces birefrigence in the material causing Faraday rotation. There are optical apparatuses that can measure polarization of a beam—and ascertain how much Faraday rotation is present or occurs (i.e., rotation of the polarization direction of the incoming photon relative to the exiting photon).

In some embodiments various functions or acts may take place at a given location and/or in connection with the operation of one or more apparatuses, systems, or devices. For example, in some embodiments, a portion of a given function or act may be performed at a first device or location, and the remainder of the function or act may be performed at one or more additional devices or locations.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

Appendices, which form a part of this disclosure, are included below. In a first of the Appendices, denoted as Appendix 1, a transfer matrix technique is described for calculating the envelope function associated with an electron. (The full wavefunction of the crystal oscillates rapidly with the periodicity of one unit cell (Bloch's theorem) while the envelope function describes the slowly varying modulation of its amplitude in the z direction.) Once the envelope function is established for several individual stationary states, the time evolution of an arbitrary superposition of these states is then computed. The concepts of the voltage algorithm in Appendix 2 are then applied to the results of the computation described in Appendix 1. Appendix 2 describes an algorithm or technique for computing controls (e.g., applied voltages) to apply in order to encourage a specific linear superposition state (input from the computations of Appendix 1) to form.

Appendix 1

The expression for the time-independent Shrodinger wave equation in one dimension (1D) is:

$$\frac{-\hbar^2}{2m}\frac{\partial^2 \psi}{\partial x^2} + V(x)\psi = E\psi$$

where V(x) is the expression for the spatially dependent potential energy, E is the energy of the state, m is the mass, and $\psi$ is the spatial probability distribution, $$\hbar \equiv \frac{h}{2\pi},$$

and h is Planck's constant.

Figure 9:
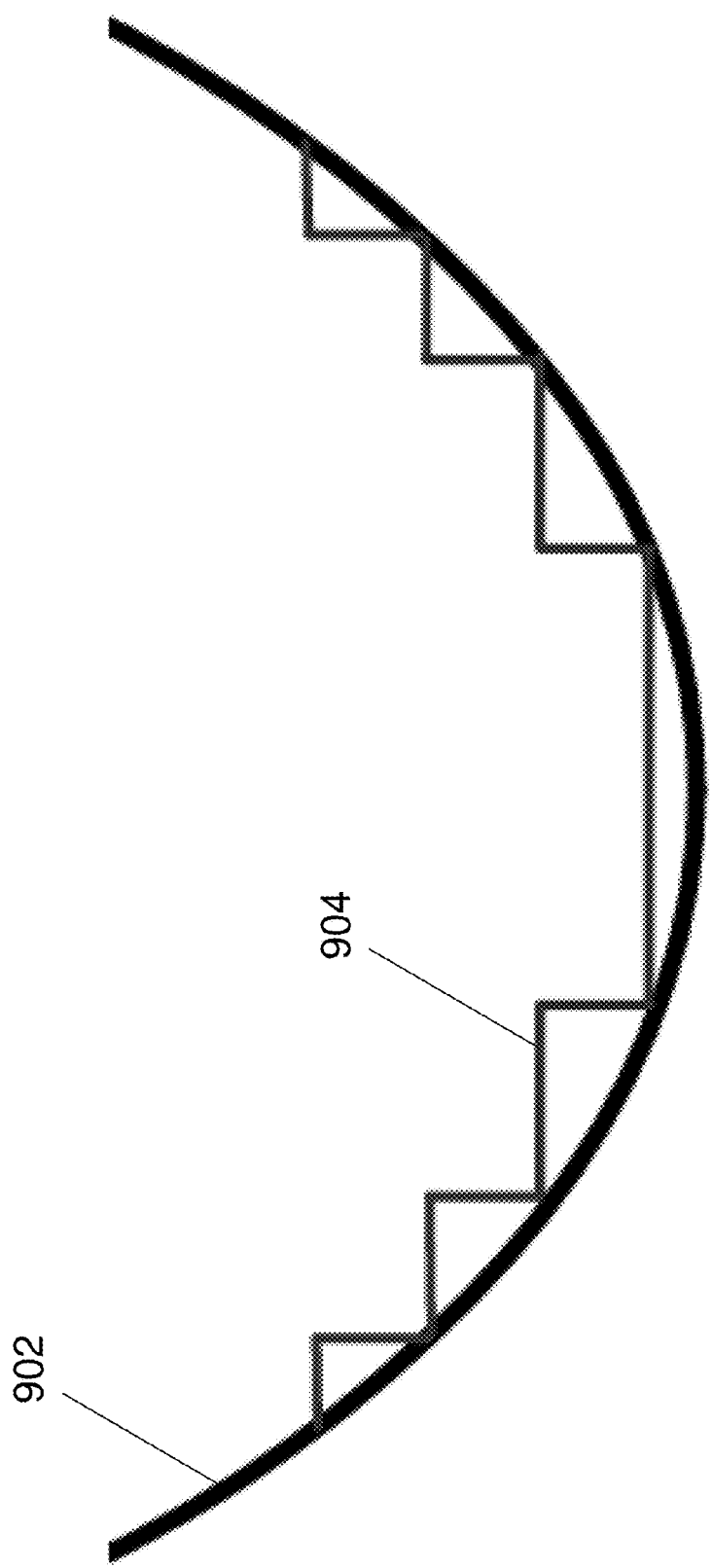
FIG. 9 illustrates a plot of a potential function, V(x), being treated as having discrete steps.

In this Appendix, solutions to the 1D Shrodinger wave equation are explored which treat the normally continuous potential energy function, V(x) 902, as if it were constant over small regions. The values for V(x) that are input into the computation are the heterojunction band offsets for the material system in question. For example, the potential may be treated as if it were discretized 904 as in FIG. 9.

The above expression for the Shrodinger wave equation can be written as:

$$\frac{-\hbar^2}{2m}\frac{\partial^2 \psi}{\partial x^2} + V(x)\psi = E\psi \rightarrow \frac{-\hbar^2}{2m}\frac{\partial^2 \psi}{\partial x^2} = [E - V(x)]\psi \rightarrow \frac{\partial^2 \psi}{\partial x^2} =$$

$$-\frac{2m}{\hbar^2}[E - V(x)]\psi \rightarrow \frac{\partial^2 \psi}{\partial x^2} = -k^2\psi \quad k = \sqrt{\frac{2m}{\hbar^2}[E - V(x)]},$$

$$\text{when } E > V \quad \frac{\partial^2 \psi}{\partial x^2} = \alpha^2\psi \quad \alpha = \sqrt{\frac{2m}{\hbar^2}[V(x) - E]}, \text{ when } E > V$$

Regions where E>V are referred to as "well regions", and when E<V, those are called "barrier regions."

Thus, the expression for a wavefunction in a well region or a barrier region is given from solutions to the 1D Shrodinger equation respectively as:

$$\psi_{WELL} = A\cos kx + B\sin kx$$

$$k = \sqrt{\frac{2m(E - V_{Well})}{\hbar^2}}, E > V_{Well} \text{ and}$$

$$\psi_{BARRIER} = C\exp(-\alpha x) + D\exp(\alpha x)$$

$$\alpha = \sqrt{\frac{2m(V_{Barrier} - E)}{\hbar^2}}, E > V_{Barrier}$$

The transfer matrix computation will assume that for the rightmost barrier region, D=0, and C=1. If D were not equal to zero, then the barrier wavefunction would become infinite as x→∞).

The transfer matrix technique presented below fixes the coefficients D=0, and C=1 in the rightmost barrier layer, and then—based on an assumed energy E, propagates the solutions leftward based on the requirement that at each interface where the potential height changes, the wavefunction and its first derivative must be equal. So, the energy is gradually stepped up (in a for loop), and at each energy, the coefficients of the wavefunction are computed and propagated to the left—so that the C and D coefficient can be computed for the leftmost barrier layer. For a valid solution to exist, the C coefficient in the leftmost barrier region must be 0 to prevent the wavefunction from becoming infinite as x→−∞. So, for a proposed energy, if C is not zero—the solution is not valid, and the energy is increased until C equals zero.

If the coefficients C and D are known for a barrier layer to the right of a well layer, then the A and B coefficients of the well layer on the left of the barrier can be determined from continuity of the wavefunction and its derivative at the interface x=$x_{INT}$. Accordingly:

$$\psi_{WELL}(x_{INT}) = \psi_{BARRIER}(x_{INT}) \quad (1A)$$

$$\frac{\partial \psi_{WELL}(x_{INT})}{\partial x} = \frac{\partial \psi_{BARRIER}(x_{INT})}{\partial x} \text{ or} \quad (1B)$$

$$A\cos kx_{INT} + B\sin kx_{INT} = C\exp(-\alpha x_{INT}) + D\exp(\alpha x_{INT}) = F \quad (2A)$$

$$Bk\cos kx_{INT} - Ak\sin kx_{INT} = -\alpha C\exp(-\alpha x_{INT}) + \alpha D\exp(\alpha x_{INT}) = G \quad (2B)$$

So: $A\cos^2 kx_{INT} + B\sin kx_{INT}\cos kx_{INT} =$ $$F\cos kx_{INT} - B\sin kx_{INT}\cos kx_{INT} + A\sin^2 kx_{INT} = -G\frac{\sin kx_{INT}}{k}$$

$$A\sin kx_{INT}\cos kx_{INT} + B\sin^2 kx_{INT} = F\sin kx_{INT}$$

$$B\cos^2 kx_{INT} - A\sin kx_{INT}\cos kx_{INT} = G\frac{\cos kx_{INT}}{k}$$

If equations (2A) and (2B) above are solved for A and B in term of F and G, what is obtained is equation (3):

$$\begin{bmatrix} A \\ B \end{bmatrix} = \begin{bmatrix} \cos kx_{INT} & -\frac{1}{k}\sin kx_{INT} \\ \sin kx_{INT} & \frac{1}{k}\cos kx_{INT} \end{bmatrix} \begin{bmatrix} F \\ G \end{bmatrix} = \begin{bmatrix} \cos kx_{INT} & -\frac{1}{k}\sin kx_{INT} \\ \sin kx_{INT} & \frac{1}{k}\cos kx_{INT} \end{bmatrix}$$

$$\begin{bmatrix} \exp(-\alpha x_{INT}) & \exp(\alpha x_{INT}) \\ -\alpha\exp(\alpha x_{INT}) & \alpha\exp(\alpha x_{INT}) \end{bmatrix} \begin{bmatrix} C \\ D \end{bmatrix}, \text{ for } x_{INT} = 0$$

$$\begin{bmatrix} A \\ B \end{bmatrix} = \begin{bmatrix} 1 & 0 \\ 0 & \frac{1}{k} \end{bmatrix} \begin{bmatrix} 1 & 1 \\ -\alpha & \alpha \end{bmatrix} \begin{bmatrix} C \\ D \end{bmatrix} = \begin{bmatrix} 1 & 0 \\ 0 & \frac{1}{k} \end{bmatrix} \begin{bmatrix} C + D \\ -\alpha C + \alpha D \end{bmatrix} = \begin{bmatrix} C + D \\ \frac{-\alpha C + \alpha D}{k} \end{bmatrix}$$

If one moves from that interface, to the left a distance L through the well, then:

$$X_{K+1,INT} = X_{K,INT} - L$$

such that one may obtain equation (4) as follows:

$$A\cos kx_{K,INT} + B\sin kx_{K,INT} = P\cos k(x_{K+1,INT} + L) + Q\sin k(x_{K+1,INT} + L) =$$

$$P[\cos(kx_{K+1,INT})\cos(kL) - \sin(kx_{K+1,INT})\sin(kL)] +$$

$$Q[\sin(kx_{K+1,INT})\cos(kL) + \sin(kL)\cos(kx_{K+1,INT})] =$$

where $$\begin{bmatrix} A \\ B \end{bmatrix} = \begin{bmatrix} \cos(kL) & \sin(kL) \\ -\sin(kL) & \cos(kL) \end{bmatrix} \begin{bmatrix} P \\ Q \end{bmatrix},$$

or $$\begin{bmatrix} P \\ Q \end{bmatrix} = \begin{bmatrix} \cos(kL) & -\sin(kL) \\ \sin(kL) & \cos(kL) \end{bmatrix} \begin{bmatrix} A \\ B \end{bmatrix}$$

Equation (4) above represents the impact on the coefficients of a translation of coordinate origin.

Now, as one progresses from right to left—the next interface encountered is a barrier, so one may now wish to solve for C and D in the leftmost barrier layer when the A and B coefficients are known for the well on the right.

Recalling equations (2A) and (2B) above, multiplying equation (2A) above by alpha may result in:

$$A\alpha \cos kx_{INT} + B\alpha \sin kx_{INT} = C\alpha \exp(-\alpha x_{INT}) + D\alpha \exp(\alpha x_{INT}) = F\alpha$$

$$Bk \cos kx_{INT} + Ak \sin kx_{INT} = -\alpha \exp(-\alpha x_{INT}) + \alpha D \exp(\alpha x_{INT}) = G$$

If the results of the two equations shown immediately above are added, C can be eliminated to solve for D in terms of the known values for A and B:

$$A\alpha \cos kx_{INT} + B\alpha \sin kx_{INT} = C\alpha \exp(-\alpha x_{INT}) + D\alpha \exp(\alpha x_{INT}) = F\alpha \quad (2A)$$

$$Bk \cos kx_{INT} - Ak \sin kx_{INT} = -\alpha C \exp(-\alpha x_{INT}) + \alpha D \exp(\alpha x_{INT}) = G \quad (2B)$$

$$[A\alpha + Bk]\cos kx_{INT} + [B\alpha - Ak]\sin kx_{INT} =$$

$$2D\alpha \exp(\alpha x_{INT}) = F\alpha + G$$

or $$D = \frac{F\alpha + G}{2\alpha} \exp(-\alpha x_{INT})$$

But, from equation (2A), an equation (5) may be obtained as follows:

$$C = \exp(\alpha x_{INT})[F - D\exp(\alpha x_{INT})] =$$

$$\exp(\alpha x_{INT})\left[F - \left\{\frac{F\alpha + G}{2\alpha}\exp(-\alpha x_{INT})\right\}\exp(\alpha x_{INT})\right]$$

$$C = \exp(\alpha x_{INT})\left[\frac{F\alpha - G}{2\alpha}\right]$$

or $$\begin{bmatrix} C \\ D \end{bmatrix} = \begin{bmatrix} \frac{\exp(\alpha x_{INT})}{2} & -\frac{\exp(\alpha x_{INT})}{2\alpha} \\ \frac{\exp(-\alpha x_{INT})}{2} & \frac{\exp(-\alpha x_{INT})}{2\alpha} \end{bmatrix}$$

$$\begin{bmatrix} F \\ G \end{bmatrix} = \begin{bmatrix} \frac{\exp(\alpha x_{INT})}{2} & -\frac{\exp(\alpha x_{INT})}{2\alpha} \\ \frac{\exp(-\alpha x_{INT})}{2} & \frac{\exp(-\alpha x_{INT})}{2\alpha} \end{bmatrix}$$

$$\begin{bmatrix} \cos(kx_{INT}) & \sin(kx_{INT}) \\ -k\sin(kx_{INT}) & k\cos(kx_{INT}) \end{bmatrix} \begin{bmatrix} A \\ B \end{bmatrix}$$

and if $x_{INT} = 0$, $$\begin{bmatrix} C \\ D \end{bmatrix} = \begin{bmatrix} \frac{1}{2} & -\frac{1}{2\alpha} \\ \frac{1}{2} & \frac{1}{2\alpha} \end{bmatrix} \begin{bmatrix} 1 & 0 \\ 0 & k \end{bmatrix} \begin{bmatrix} A \\ B \end{bmatrix} = \begin{bmatrix} \frac{1}{2} & -\frac{k}{2\alpha} \\ \frac{1}{2} & \frac{k}{2\alpha} \end{bmatrix} \begin{bmatrix} A \\ B \end{bmatrix}$$

The effect of the potential through the barrier from the right side to the left side of the barrier may be propagated to determine what such a coordinate shift does to the coefficients of the exponentials. The following equation (6) may be obtained:

$$C_R \exp(-\alpha x_{K,INT}) + D_R \exp(\alpha x_{K,INT}) =$$

$$C_L \exp[-\alpha(x_{K+1,INT} + L)] + D_L[\exp\alpha(x_{K+1,INT} + L)]$$

where $$\begin{bmatrix} C_R \\ D_R \end{bmatrix} = \begin{bmatrix} \exp(-\alpha L) & 0 \\ 0 & \exp(\alpha L) \end{bmatrix} \begin{bmatrix} C_L \\ D_L \end{bmatrix},$$

$$\begin{bmatrix} C_L \\ D_L \end{bmatrix} = \begin{bmatrix} \exp(\alpha L) & 0 \\ 0 & \exp(-\alpha L) \end{bmatrix} \begin{bmatrix} C_R \\ D_R \end{bmatrix}$$

If the coefficients A and B are known for a well layer to the right of a different well layer, then the A and B coefficients of the well layer on the left of the well layer on the right can be determined from continuity of the wavefunction and its derivative at the interface $x = x_{INT}$. Equation (7) may be obtained as follows:

$$\psi_{LEFT\_WELL}(x_{INT}) = \psi_{RIGHT\_WELL}(x_{INT})$$

$$\frac{\partial \psi_{LEFT\_WELL}(x_{INT})}{\partial x} = \frac{\partial \psi_{RIGHT\_WELL}(x_{INT})}{\partial x}$$

or $$A_{LEFT}\cos k_{LEFT}x_{INT} + B_{LEFT}\sin k_{LEFT}x_{INT} =$$

$$A_{RIGHT}\cos(k_{RIGHT}x_{INT}) + B_{RIGHT}\sin(k_{RIGHT}x_{INT}) = F$$

$$B_{LEFT}k_{LEFT}\cos k_{LEFT}x_{INT} - A_{LEFT}k_{LEFT}\sin kx_{int} =$$

$$B_{RIGHT}k_{RIGHT}\cos k_{RIGHT}x_{INT} - A_{RIGHT}k_{RIGHT}\sin k_{RIGHT}x_{INT} = G$$

$$A_{LEFT} = \frac{[F - B_{LEFT}\sin k_{LEFT}x_{INT}]}{\cos k_{LEFT}x_{INT}}$$

$$B_{LEFT}k_{LEFT}\cos k_{LEFT}x_{INT} -$$

$$\frac{[F - B_{LEFT}\sin k_{LEFT}x_{INT}]}{\cos k_{LEFT}x_{INT}}k_{LEFT}\sin k_{LEFT}x_{INT} = G$$

$$B_{LEFT}\left[\cos k_{LEFT}x_{INT} + \frac{\sin^2 k_{LEFT}x_{INT}}{\cos k_{LEFT}x_{INT}}\right]k_{LEFT} =$$

$$G + \frac{F}{\cos k_{LEFT}x_{INT}}k_{LEFT}\sin k_{LEFT}x_{INT}$$

$$B_{LEFT} = \frac{G + \frac{F}{\cos k_{LEFT}x_{INT}}k_{LEFT}\sin k_{LEFT}x_{INT}}{\left[\cos k_{LEFT}x_{INT} + \frac{\sin^2 k_{LEFT}x_{INT}}{\cos k_{LEFT}x_{INT}}\right]k_{LEFT}} =$$

$$\frac{G\cos k_{LEFT}x_{INT} + Fk_{LEFT}\sin k_{LEFT}x_{INT}}{k_{LEFT}}$$

$$\begin{bmatrix} A_{LEFT} \\ B_{LEFT} \end{bmatrix} = \begin{bmatrix} \frac{1}{\cos k_{LEFT}x_{INT}} - \frac{\sin^2 k_{LEFT}x_{INT}}{\cos k_{LEFT}x_{INT}} & -\left(\frac{\sin k_{LEFT}x_{INT}}{k_{LEFT}}\right) \\ \sin k_{LEFT}x_{INT} & \frac{\cos k_{LEFT}x_{INT}}{k_{LEFT}} \end{bmatrix}$$

$$\begin{bmatrix} F \\ G \end{bmatrix} = = \begin{bmatrix} \cos k_{LEFT}x_{INT} & -\left(\frac{\sin k_{LEFT}x_{INT}}{k_{LEFT}}\right) \\ \sin k_{LEFT}x_{INT} & \frac{\cos k_{LEFT}x_{INT}}{k_{LEFT}} \end{bmatrix}$$

$$\begin{bmatrix} \cos(k_{RIGHT}x_{INT}) & \sin(k_{RIGHT}x_{INT}) \\ -k_{RIGHT}\sin(k_{RIGHT}x_{INT}) & k_{RIGHT}\cos(k_{RIGHT}x_{INT}) \end{bmatrix} \begin{bmatrix} A_{RIGHT} \\ B_{RIGHT} \end{bmatrix}$$

In the above equation (7), if $k_{LEFT} = k_{RIGHT}$, then as expected:

$$\begin{bmatrix} A_{LEFT} \\ B_{LEFT} \end{bmatrix} = \begin{bmatrix} A_{RIGHT} \\ B_{RIGHT} \end{bmatrix}$$

If the coefficients C and D are known for a barrier layer to the right of another barrier layer, then the C and D coefficients of the barrier layer on the left of the rightmost barrier can be determined from continuity of the wavefunction and its derivative at the interface $x=x_{INT}$. Equation (8) may be obtained as follows:

$$\psi_{LEFT\_BARRIER}(x_{INT}) = \psi_{RIGHT\_BARRIER}(x_{INT})$$

$$\frac{\partial \psi_{LEFT\_BARRIER}(x_{INT})}{\partial} = \frac{\partial \psi_{RIGHT\_BARRIER}(x_{INT})}{\partial}$$

or $$C_{LEFT}\exp(-\alpha_{LEFT}x_{INT}) + D_{LEFT}\exp(\alpha_{LEFT}x_{INT}) =$$
$$C_{RIGHT}\exp(-\alpha_{RIGHT}x_{INT}) + D_{RIGHT}\exp(\alpha_{RIGHT}x_{INT}) = F$$

$$-\alpha_{LEFT}C_{LEFT}\exp(-\alpha_{LEFT}x_{INT}) + \alpha_{LEFT}D_{LEFT}\exp(\alpha_{LEFT}x_{INT}) =$$
$$-\alpha_{RIGHT}C_{RIGHT}\exp(-\alpha_{RIGHT}x_{INT}) +$$
$$\alpha_{RIGHT}D_{RIGHT}\exp(\alpha_{RIGHT}x_{INT}) = G$$

$$C_{LEFT} = \frac{F - D_{LEFT}\exp(\alpha_{LEFT}x_{INT})}{\exp(-\alpha_{LEFT}x_{INT})}$$

$$-\alpha_{LEFT}\left[\frac{F - D_{LEFT}\exp(\alpha_{LEFT}x_{INT})}{\exp(-\alpha_{LEFT}x_{INT})}\right]\exp(-\alpha_{LEFT}x_{INT}) +$$
$$\alpha_{LEFT}D_{LEFT}\exp(\alpha_{LEFT}x_{INT}) = G,$$

$$-\alpha_{LEFT}[F - D_{LEFT}\exp(\alpha_{LEFT}x_{INT})] + \alpha_{LEFT}D_{LEFT}\exp(\alpha_{LEFT}x_{INT}) = G.$$

$$D_{LEFT} = \left[\frac{G + \alpha_{LEFT}F}{2\alpha_{LEFT}}\right]\exp(-\alpha_{LEFT}x_{INT})$$

$$C_{LEFT} = \frac{F - D_{LEFT}\exp(\alpha_{LEFT}x_{INT})}{\exp(-\alpha_{LEFT}x_{INT})} = \left\{F - \left[\frac{G + \alpha_{LEFT}F}{2\alpha_{LEFT}}\right]\right\}\exp(\alpha_{LEFT}x_{INT})$$

$$\begin{bmatrix} C_{LEFT} \\ D_{LEFT} \end{bmatrix} = \begin{bmatrix} \frac{\exp(\alpha_{LEFT}x_{INT})}{2} & -\frac{\exp(\alpha_{LEFT}x_{INT})}{2\alpha_{LEFT}} \\ \frac{\exp(-\alpha_{LEFT}x_{INT})}{2} & \frac{\exp(-\alpha_{LEFT}x_{INT})}{2\alpha_{LEFT}} \end{bmatrix}$$

$$\begin{bmatrix} F \\ G \end{bmatrix} = \begin{bmatrix} \frac{\exp(\alpha_{LEFT}x_{INT})}{2} & -\frac{\exp(\alpha_{LEFT}x_{INT})}{2\alpha_{LEFT}} \\ \frac{\exp(-\alpha_{LEFT}x_{INT})}{2} & \frac{\exp(-\alpha_{LEFT}x_{INT})}{2\alpha_{LEFT}} \end{bmatrix}$$

$$\begin{bmatrix} \exp(-\alpha_{RIGHT}x_{INT}) & \exp(\alpha_{RIGHT}x_{INT}) \\ -\alpha_{RIGHT}\exp(-\alpha_{RIGHT}x_{INT}) & \alpha_{RIGHT}\exp(\alpha_{RIGHT}x_{INT}) \end{bmatrix} \begin{bmatrix} C_{RIGHT} \\ D_{RIGHT} \end{bmatrix}$$

In the above equation (8), if $\alpha_{LEFT}=\alpha_{RIGHT}$, then:

$$\begin{bmatrix} C_{LEFT} \\ D_{LEFT} \end{bmatrix} = \begin{bmatrix} C_{RIGHT} \\ D_{RIGHT} \end{bmatrix}$$

Appendix 2

In this Appendix, an algorithm is discussed for computing what specific time-varying z-depending perturbation voltage V(z,t) needs to be applied (e.g., by the vertical profile unit to the semiconductor superlattice) in order to encourage a linear superposition state to form. The time-varying linear superposition state computed in appendix 1 (by applying the evolution operator), is used as an input to this procedure. The time evolution of two different states of the unperturbed Hamiltonian (as well as their linear superposition) is given as:

$$H_{UNPERTURBED}\psi_1 = E_1\psi_1 = i\hbar\frac{\partial \psi_1}{\partial t} \to \psi_1(t) = \psi_1(0)\exp\left[-i\frac{E_1 t}{\hbar}\right]$$

$$H_{UNPERTURBED}\psi_2 = E_2\psi_2 = i\hbar\frac{\partial \psi_2}{\partial t} \to \psi_2(t) = \psi_2(0)\exp\left[-i\frac{E_2 t}{\hbar}\right]$$

$$H_{UNPERTURBED}[a\psi_1 + b\psi_2] = a\psi_1(0)\exp\left[-i\frac{E_1 t}{\hbar}\right] + b\psi_2(0)\exp\left[-i\frac{E_2 t}{\hbar}\right]$$

A linear superposition state may be defined as:

$$\psi_{12} = a\psi_1 + b\psi_2,$$

and the behavior of the superposition state we desire to create under an applied perturbation, V(t) is described by the perturbed Hamiltonian:

$$[H_{UNPERTURBED} + V_{PERTURB}(t)][\psi_{12}] = H_{PERTURBED}\psi_{12}.$$

An eigenvalue $E_Q$, of the perturbed equation obeys:

$$H_{PERTURBED}\psi_{12} = E_Q\psi_{12}(t),$$

where the existence of $E_Q$ would imply that the linear superposition state $\psi_{12}$ is a "stable", "quasi-stationary" state of the perturbed Hamiltonian. That is to say, we seek a time varying voltage where the linear superposition state we are trying to create is "stable" under the perturbation.

Thus, one is lead to consider:

$$H_{PERTURBED}\psi_{12} = [H_{UNPERTURBED} + V_{PERTURB}(t)]\psi_{12}$$

$$a[E_1 + V_{PERTURB}(t)]\exp\left[-i\frac{E_1 t}{\hbar}\right]\psi_1(0) +$$
$$b[E_2 + V_{PERTURB}(t)]\exp\left[-i\frac{E_2 t}{\hbar}\right]\psi_2(0) = aE_1\exp\left[-i\frac{E_1 t}{\hbar}\right]\psi_1(0) +$$
$$bE_2\exp\left[-i\frac{E_2 t}{\hbar}\right]\psi_2(0) + V_{PERTURB}(t)\psi_{12}(t) = E_Q\psi_{12}$$

The equation above may solved for V(t) (the unknown output voltage to apply) to obtain:

$$V_{PERTURB}(t) = \frac{E_Q\psi_{12} - aE_1\exp\left[-i\frac{E_1 t}{\hbar}\right]\psi_1(0) - bE_2\exp\left[-i\frac{E_2 t}{\hbar}\right]\psi_2(0)}{\psi_{12}(t)} =$$

$$E_Q - \left[\frac{aE_1\exp\left[-i\frac{E_1 t}{\hbar}\right]\psi_1(0) + bE_2\exp\left[-i\frac{E_2 t}{\hbar}\right]\psi_2(0)}{\psi_{12}(t)}\right] = E_Q - \left[\frac{aE_1\exp\left[-i\frac{E_1 t}{\hbar}\right]\psi_1(0) + bE_2\exp\left[-i\frac{E_2 t}{\hbar}\right]\psi_2(0)}{a\exp\left[-i\frac{E_1 t}{\hbar}\right]\psi_1(0) + b\exp\left[-i\frac{E_2 t}{\hbar}\right]\psi_2(0)}\right] =$$

-continued $$E_Q - \left[\frac{aE_1\exp\left[-i\frac{E_1 t}{\hbar}\right]\psi_1(0) + bE_2\exp\left[-i\frac{E_2 t}{\hbar}\right]\psi_2(0)}{a\exp\left[-i\frac{E_1 t}{\hbar}\right]\psi_1(0) + b\exp\left[-i\frac{E_2 t}{\hbar}\right]\psi_2(0)}\right]\left[\frac{a\exp\left[i\frac{E_1 t}{\hbar}\right]\psi_1(0) + b\exp\left[i\frac{E_2 t}{\hbar}\right]\psi_2(0)}{a\exp\left[i\frac{E_1 t}{\hbar}\right]\psi_1(0) + b\exp\left[i\frac{E_2 t}{\hbar}\right]\psi_2(0)}\right] =$$

$$E_Q - \left[\frac{a^2 E_1\psi_1^2(0) + ab\left\{E_2\exp\left[-i\frac{(E_2-E_1)t}{\hbar}\right] + E_1\exp\left[i\frac{(E_2-E_1)t}{\hbar}\right]\right\}\psi_1(0)\psi_2(0) - b^2 E_2\psi_2^2(0)}{a^2\psi_1^2(0) + 2ab\cos\left[\frac{(E_2-E_1)t}{\hbar}\right]\psi_1(0)\psi_2(0) + b^2\psi_2^2(0)}\right] =$$

$$E_Q - \left[\frac{a^2 E_1\psi_1^2(0) + ab\left\{(E_2-E_1)\exp\left[-i\frac{(E_2-E_1)t}{\hbar}\right] + 2E_1\cos\left[\frac{(E_2-E_1)t}{\hbar}\right]\right\}\psi_1(0)\psi_2(0) + b^2 E_2\psi_2^2(0)}{a^2\psi_1^2(0) + 2ab\cos\left[\frac{(E_2-E_1)t}{\hbar}\right]\psi_1(0)\psi_2(0) + b^2\psi_2^2(0)}\right] =$$

$$V_{PERTURB}(t) = (E_Q - E_1) - \frac{ab(E_2-E_1)\exp\left[-i\frac{(E_2-E_1)t}{\hbar}\right]\psi_1(0)\psi_2(0)}{a^2\psi_1^2(0) + 2ab\cos\left[\frac{(E_2-E_1)t}{\hbar}\right]\psi_1(0)\psi_2(0) + b^2\psi_2^2(0)}$$

If, $E_Q = E_1$, then:

$$V_{PERTURB}(t) = -\frac{ab(E_2-E_1)\exp\left[-i\frac{(E_2-E_1)t}{\hbar}\right]\psi_1(0)\psi_2(0)}{a^2\psi_1^2(0) + 2ab\cos\left[\frac{(E_2-E_1)t}{\hbar}\right]\psi_1(0)\psi_2(0) + b^2\psi_2^2(0)} =$$

$$\frac{-ab(E_2-E_1)\exp\left[-i\frac{(E_2-E_1)t}{\hbar}\right]\psi_1(t=0)\psi_2(t=0)}{|\psi_{12}(t)|^2}$$

The result above has a semi-intuitive interpretation, which may be succinctly stated as: "If one ultimately wants to form a linear superposition state of the unperturbed Hamiltonian (i.e. the desired output computed in Appendix 1) by applying a perturbing voltage (i.e. the input), such that the desired unperturbed output state is also a stable quasi-stationary state of the perturbed Hamiltonian (when voltage is on), then the sought after voltage has the effect that it must discourage the electron from being somewhere when the voltage is large, and encourage the electron to stay where it is if the voltage is small." For example, in the expression above, wherever the denominator $|\psi_{12}(t)|$ is large, Vperturb(t) should be small and whenever $|\psi_{12}(t)|$ is small, Vperturb(t) should be large. Whenever the linear superposition state $\psi_{12}(t)$ is zero, that means the two individual states destructively cancel each other in a node—and in such case one should apply a large voltage there to reinforce the node.

This algorithm says that if one applies the above perturbing voltage, then the linear superposition state $\psi_{12}(t)$ will be a quasi-stationary (stable eigenvector) of the perturbed Hamiltonian and a linear superposition state of the unperturbed Hamiltonian simultaneously. The proof can be extended to more than 2 superposition states.

In the above expression, the variable z was dropped. If the variable z is included, one obtains:

tion in peak-to-peak amplitude as a function of z, while the numerator stipulates a phase. What emerges from the lithium niobate waveguide is an electric field (that provides the necessary oscillation frequency $\omega_{12}$ in the field itself), not a voltage, so—for the niobate structure, the electric field must vary according to:

$$E_z(z, t) = -\frac{\partial V_{PERTURB}(z, t)}{\partial z}$$

Figure 10:
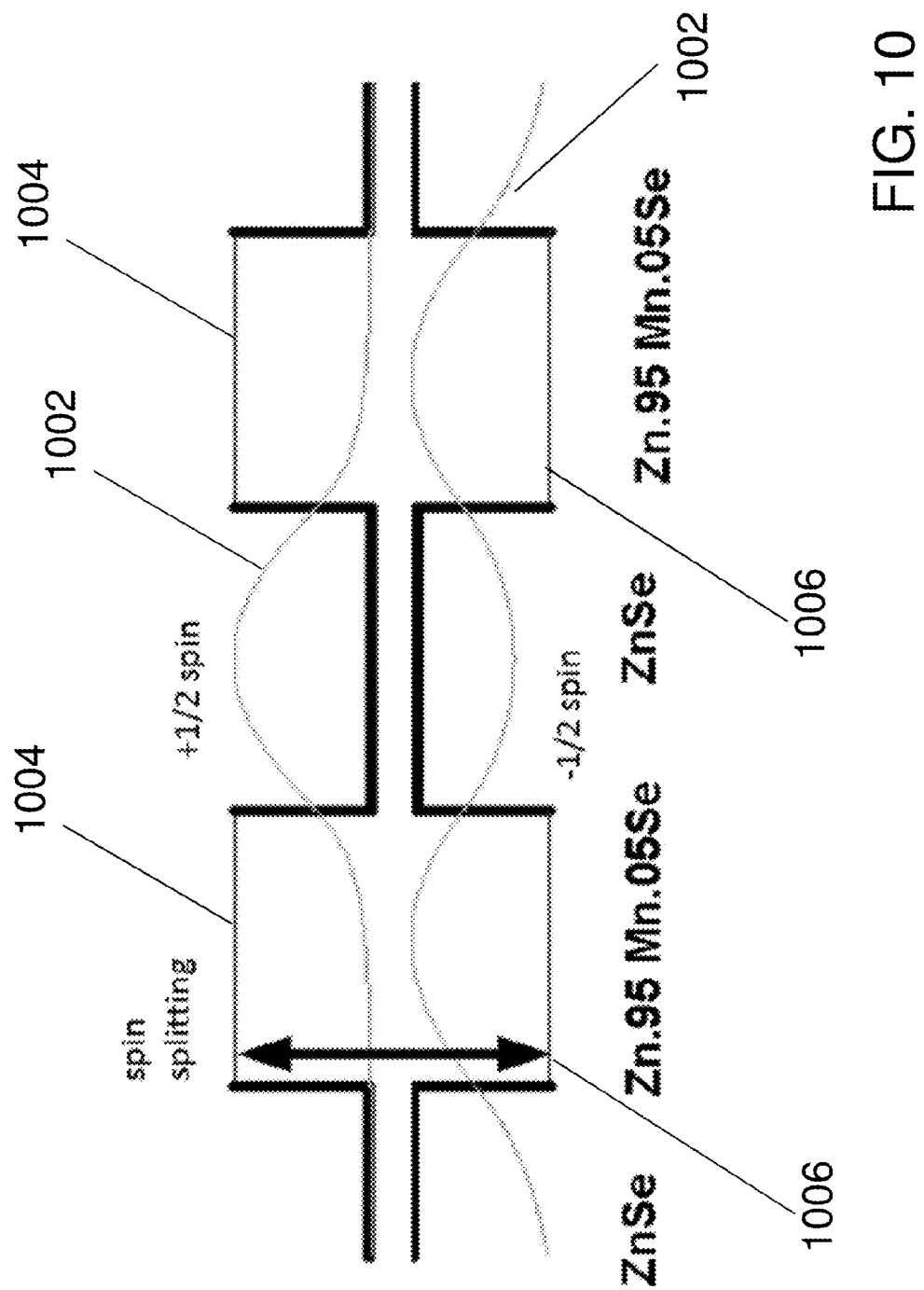
FIG. 10 illustrates a plot of the envelope function of the two spin states of the electron in a spin superlattice.

FIG. 10 shows a calculation (using the transfer matrix technique described in the Appendix 1 above) of the envelope function part of the wavefunction in a ZnSe/Zn.95Mn.05Se spin superlattice (each layer 200 Angstroms) for the two electron spins plotted as 1002. The upper part of the FIG. 10 shows the envelope function for the $+\frac{1}{2}$ spin electron in the conduction band, while the bottom part of the figure shows the $-\frac{1}{2}$ spin electron. In an externally applied magnetic field, the presence of the Mn greatly enhances the Zeeman splitting (shown in the figure as the splitting between the lines 1004 and 1006). There is a small Zeeman splitting in the ZnSe layer, as indicated.

Numbers for the band offsets are taken from J. K. Furdyna J. Appl. Phys. 64, R29 (1988), i.e., since the CdSe bandgap is 1.83 eV (at liquid helium temperatures), the MnSe gap is 3.3 eV, the ZnSe gap is 2.82 eV, the bandgap of $Zn(1-y)Mn(y)Se=2.82+y(3.3-2.82)$, the bandgap of $Cd(1-y)Mn(y)Se=1.83+y(3.3-1.83)$, the resulting expression for ZnCdMnSe is:

Zn_1-x-y_Cd_x_Mn_y_Se=[2.82+y(3.3-2.82)]+x
[2.82+y(3.3-2.82)−{1.83+y(3.3-1.83)}]

Various references give the electron effective mass, and the band offsets (approximately 75/25 conduction band offset to valence band offset). The ratio of the $+\frac{1}{2}$ to $-\frac{1}{2}$ spin splitting $$V_{PERTURB}(z, t) = \frac{-ab(E_2-E_1)\exp\left[-i\frac{(E_2-E_1)t}{\hbar}\right]\psi_1(z, t=0)\psi_2(z, t=0)}{a^2\psi_1^2(z, t=0) + 2ab\cos\left[\frac{(E_2-E_1)t}{\hbar}\right]\psi_1(z, t=0)\psi_2(z, 0) + b^2\psi_2^2(z, t=0)}$$

In the above expression, one sees that there is a z-dependence to the amplitude and phase of the oscillation frequency $\omega_{12}$. The oscillation in the denominator stipulates the variation in the conduction band to the splitting of the heavy hole states in the valence band is given by Furdyna's paper as the ratio of $N_0 \alpha/N_0 \beta$. All of these considerations may be included in an automated tool which may be used to produce FIG. 10. The confinement energy of the +½ electron in the ZnSe layer can be increased by decreasing the width of the ZnSe layer. Thus it is possible, to create a plurality of multiple quantum well systems of different particles (different particles because they are all separated by a large enough barrier region that a single electron cannot tunnel through them), where the ZnSe layer thickness changes gradually enough so that the +½ electrons in each quantum well system have an identifiable energy difference relative to each other.

While it may be desirable to be able to compute the confinement energies a-priori (as in Appendix 1—which gives the envelope function and the energies), it may be more important to measure their exact energies experimentally. For example, the description above is primarily focused on the electron states, but the conduction to valence band transition contains the confinement energy of the electron state plus the confinement energy of the hole state. The splitting between just the +½ and −½ electrons needs to be decoupled from this sum by a careful consideration of the values of $N_0 \alpha$ and $N_0 \beta$. Very sensitive measurements of energy differences can be ascertained through optically detected cyclotron resonance (ODCR) and photoluminescence excitation (PLE), using a grating spectrometer. Energy measurements can be correlated to spatial positions using a setup similar to what is employed for a Raman microscope as would be known to one of skill in the art.

Once the spin splitting is ascertained experimentally, then the experimentally determined energy difference of $$\omega_{12} = \frac{(E_2 - E_1)}{\hbar}$$

can be used in an a-priori calculation to determine how to apply the voltages.

It is possible to design quantum well structures with larger well widths to accommodate, e.g., limitations in the size of the lithium niobate fingers.

In some embodiments, an entire apparatus is seated in a liquid Helium magnetic cryostat, which uses a superconducting magnet to apply a magnetic field in the z-direction of the structure. Electrons are populated in the conduction band through optical pumping. The electronic states are entangled by the vertical profile units using the techniques described above. During this time, a break is made in the squid magnetometer so it doesn't interfere with the entanglement being induced in the electronic states. After the entanglement is reached, the vertical profile units are shutoff. Then, quantum computations are performed by applying short duration magnetic pulses to the solenoid coils that are wrapped around the vertical profile unit. These short duration magnetic pulses correspond to the types of operations that are performed during nuclear magnetic resonance (NMR) to process the spins. Each magnetic pulse could be compared to a sequential logic operation performed in a digital computer during the transition of a clock pulse, except that the sequential short duration magnetic pulses in this apparatus are the analog operations being performed by the NMR quantum computer.

What is claimed is:

1. A method for engineering an optical quantum computing structure, comprising:
   etching a plurality of gaps in an electro-optical slab to define a plurality of fingers that extend between a first horizontal side and a second horizontal side of the electro-optical slab, the plurality of fingers constructed from an electro-optical material coupled to a plurality of optical feed lines to form a respective waveguide;
   disposing a semiconductor quantum well structure at a first vertical surface of the electro-optical slab;
   outputting light from the plurality of fingers along a first axis to strike at least one layer of the semiconductor quantum well structure and generate a spectrum of energy transitions;
   applying an electric field to the electric field electrodes along a second axis perpendicular to the first axis;
   measuring energy eigenstates of a Hamiltonian of the optical quantum computing structure in response to recording the spectrum of energy transitions;
   predicting a time evolution of a combination of two energy eigenstates of the optical quantum computing structure based on the measurement; and
   controlling the electric field to create an entangled quantum state for two coefficients of the two energy eigenstates such that an associated wavefunction is encouraged to undergo the predicted time evolution.

2. The method of claim 1, wherein the combination of the two energy eigenstates is a linear combination.

3. The method of claim 1, wherein the prediction of the time evolution is based on an evolution operator of quantum physics.

4. The method of claim 1, where the measurement is performed optically by recording a spectrum of energy transitions.

5. The method of claim 1, wherein the state is created based on the application of the electric field to the electric field electrodes.

6. The method of claim 1, wherein the structure comprises a plurality of fingers coupled to a corresponding plurality of optical feed lines, and wherein the fingers are constructed from an electro-optical material.

7. The method of claim 6, wherein the optical feed lines all operate at the same frequency, and wherein the fingers are formed by etching, and wherein each of the fingers comprises an electrode, and wherein an electric field is applied between the electrodes of the fingers and a ground plane established by a metallic electrode, and wherein light outputs from the fingers strike different layers of a semiconductor multiple quantum well structure, and wherein the electro-optical material comprises lithium niobate.

8. The method of claim 6, wherein an amplitude and phase of light output from the fingers is controlled based at least in part on a difference in an applied electric field between the fingers.

9. The method of claim 6, wherein the electro-optical material comprises at least one of: barium titanate, strontium titanate, and ferroelectric BST thin film, such that photons are conducted through metallic electrodes of the fingers.

10. The method of claim 6, further comprising:
    obtaining, via squid magnetometers coupled to the fingers, magnetic field measurements subsequent to the creation of the entangled quantum state.

11. The method of claim 1, wherein the plurality of fingers are formed as a plurality of single frequency vertical profile waveguides arranged alongside each other.

12. The method of claim 11, wherein a formation of the structure comprises:
    etching a first set of ridges into a first side of a monolithic slab of lithium niobate;
    flipping the slab subsequent to etching the first set of ridges;
    etching a second set of ridges into a second side of the slab subsequent to the flipping; and
    backfilling metal into the second set of ridges.

13. An optical quantum computing structure comprising:
- an electro-optical slab having gaps formed therein to define a plurality of fingers each extending between a first horizontal sidewall and a second horizontal sidewall of the electro-optical slab;
- the plurality of fingers constructed from an electro-optical material coupled to a plurality of optical feed lines to form a respective waveguide;
- a ground electrode formed on the upper surface and an electric field electrode coupled to a lower surface of each finger;
- a semiconductor quantum well structure disposed at a first vertical surface of the electro-optical slab such that light is output from the plurality of fingers along a first axis to strike at least one layer of the semiconductor quantum well structure to generate a spectrum of energy transitions,
- wherein an electric field is applied to the electric field electrodes along a second axis perpendicular to the first axis and is controlled to create an entangled quantum state for at least two coefficients of a combination of at least two energy eigenstates of the optical quantum computing structure such that an associated wavefunction is encouraged to undergo a predicted time evolution that is based on measured energy eigenstates.

14. The structure of claim 13, wherein the measured energy eigenstates are determined optically based on a recording of spectrum of energy transitions generated in response to outputting the light from the plurality of fingers to the semiconductor quantum well structure.

15. The structure of claim 13, wherein the optical feed lines all operate at the same frequency, and wherein the fingers are formed by etching, and wherein the electric field is applied between the electrodes of the fingers and a ground plane established by a metallic electrode, and wherein light outputs from the fingers strike different layers of a semiconductor multiple quantum well structure, and wherein the electro-optical material comprises lithium niobate.

16. The structure of claim 13, wherein an amplitude and phase of light output from the fingers is controlled based at least in part on a difference in the electric field applied between the electrodes coupled to the fingers.

17. The structure of claim 13, wherein the electro-optical material comprises at least one of: barium titanate, strontium titanate, and ferroelectric BST thin film, and wherein photons are conducted through the electrodes.

18. The structure of claim 17, wherein the structure comprises a plurality of single frequency vertical profile units placed alongside each other.

19. The structure of claim 18, wherein the structure comprises:
- a first set of ridges etched into a first side of a monolithic slab of lithium niobate;
- a second set of ridges etched into a second side of the slab; and
- metal backfilled into the second set of ridges.

20. The structure of claim 18, wherein the plurality of single frequency vertical profile units are bonded to one another.

* * * * *